(12) United States Patent
West et al.

(10) Patent No.: US 11,056,372 B2
(45) Date of Patent: Jul. 6, 2021

(54) LOW TEMPERATURE BIASABLE SUBSTRATE SUPPORT

(71) Applicant: Applied Materials, Inc., Santa Clara, CA (US)

(72) Inventors: Brian T. West, San Jose, CA (US); Soundarrajan Jembulingam, Bangalore (IN); Dinkesh Huderi Somanna, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 139 days.

(21) Appl. No.: 16/447,518

(22) Filed: Jun. 20, 2019

(65) Prior Publication Data

US 2020/0350195 A1 Nov. 5, 2020

(30) Foreign Application Priority Data

Apr. 30, 2019 (IN) .............................. 201941017120

(51) Int. Cl.
*H01L 21/683* (2006.01)
*H01L 21/67* (2006.01)
*H02H 7/20* (2006.01)

(52) U.S. Cl.
CPC .... *H01L 21/6833* (2013.01); *H01L 21/67103* (2013.01); *H02H 7/20* (2013.01)

(58) Field of Classification Search
CPC ......... H01L 21/67103; H01L 21/67109; H01L 21/67248; H01L 21/6833; H01L 21/68785; H01L 21/68792
USPC .................................................. 361/103, 234
See application file for complete search history.

(56) References Cited

U.S. PATENT DOCUMENTS

| 6,081,414 | A | 6/2000 | Flanigan et al. | |
|---|---|---|---|---|
| 7,480,129 | B2 | 1/2009 | Brown et al. | |
| 7,601,393 | B2 | 10/2009 | Chiang et al. | |
| 7,959,734 | B2 * | 6/2011 | Hayashi | H01L 21/68792 118/725 |
| 9,883,549 | B2 * | 1/2018 | Matyushkin | H01L 21/67248 |
| 10,153,192 | B2 * | 12/2018 | Maeta | H01L 21/6833 |
| 2003/0057198 | A1 * | 3/2003 | Kobayashi | H01L 21/67109 219/390 |
| 2004/0040665 | A1 | 3/2004 | Mizuno et al. | |
| 2006/0191482 | A1 * | 8/2006 | Kanno | H01J 37/32935 118/725 |

(Continued)

FOREIGN PATENT DOCUMENTS

JP 2008187103 A 8/2008

OTHER PUBLICATIONS

International Search Report and Written Opinion for PCT/US2020/024306 dated Jul. 21, 2020.

*Primary Examiner* — Jared Fureman
*Assistant Examiner* — Nicolas Bellido
(74) *Attorney, Agent, or Firm* — Patterson + Sheridan, LLP

(57) ABSTRACT

Embodiments described herein relate to a substrate support and techniques for controlling a temperature of the same. The substrate support includes a heating element and an over temperature switch disposed therein. The heating element heats the substrate support and a substrate disposed thereon. The over temperature switch controls a temperature of the heating element and the substrate support. The over temperature switch is operable to switch states in response to a temperature of the substrate support exceeding a predefined temperature.

18 Claims, 5 Drawing Sheets

(56) References Cited

U.S. PATENT DOCUMENTS

| | | | |
|---|---|---|---|
| 2014/0073066 A1* | 3/2014 | Tabuchi | H01J 37/32724 438/5 |
| 2015/0077895 A1* | 3/2015 | Jindo | C04B 35/58092 361/234 |
| 2016/0135252 A1 | 5/2016 | Matyushkin et al. | |
| 2018/0122680 A1* | 5/2018 | Yang | H01L 21/67288 |
| 2019/0019714 A1 | 1/2019 | Kosakai et al. | |

\* cited by examiner

LOW TEMPERATURE BIASABLE SUBSTRATE SUPPORT

CROSS-REFERENCE TO RELATED APPLICATIONS

This application claims benefit of Indian Provisional Application 201941017120 filed on Apr. 30, 2019 at the Indian Patent Office, which is herein incorporated by reference.

BACKGROUND

Field

Embodiments of the present disclosure generally relate to process chambers for fabricating microelectronic devices, and more specifically to substrate supports disposed in the chambers.

Description of the Related Art

Substrate supports are widely used to hold substrates, such as semiconductor wafers, during processing of the substrates in process chambers. Process performed in the process chambers may include physical vapor deposition, chemical vapor deposition, or etching. One particular substrate support is an electrostatic chuck. The substrate support may be fabricated from a dielectric or semi-conductive material across which an electrostatic clamping field can be generated.

An electrostatic chuck typically includes one or more electrodes embedded therein. One or more heating elements may also be embedded in the electrostatic chuck. During processing, the heating elements are used to heat the electrostatic chuck. A temperature of the electrostatic chuck may continue to rise above a temperature of the heater due to the thermal conduction of heat in the process chamber. Damage can occur to the electrostatic chuck if the temperature of the electrostatic chuck rises above a maximum temperature of the electrostatic chuck.

Thus, there is a need for improved apparatus and methods to substantially reduce an occurrence of the substrate support overheating.

SUMMARY

In one embodiment, a substrate support is provided which includes a body having a heating element. An over temperature switch is disposed in the substrate support. The over temperature switch is operable to switch states in response to detecting a temperature which exceeds a predefined temperature. In another embodiment, a substrate support is provided which includes an electrostatic chuck. A cooling plate having a first surface and a second surface opposite the first surface is disposed with the first surface adjacent to the electrostatic chuck. A recess is formed in the second surface of the cooling plate. An opening is formed through the cooling plate. A central insulator is disposed in the opening. An over temperature switch is disposed in the recess and is operable to switch states in response to the cooling plate exceeding a predefined temperature. An electrical insulator is disposed between the recess and the over temperature switch.

In another embodiment, a substrate support is provided which includes an electrostatic chuck. A cooling plate having a first surface and a second surface opposite the first surface is disposed with the first surface adjacent to the electrostatic chuck. A recess is formed in the second surface of the cooling plate. An opening is formed through the cooling plate. A central insulator is disposed in the opening. An over temperature switch is disposed in the recess and is operable to switch states in response to the cooling plate exceeding a predefined temperature. One or more grooves are formed in the central insulator. One or more low voltage cables are coupled to the over temperature switch and at least partially disposed in the grooves. An electrical insulator is disposed between the recess and the over temperature switch.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a substrate support and techniques for controlling a temperature of the same. The substrate support includes a heating element and an over temperature switch disposed therein. The heating element heats the substrate support and a substrate disposed thereon. The over temperature switch controls a temperature of the heating element and the substrate support. The over temperature switch is operable to switch states in response to a temperature of the substrate support exceeding a predefined temperature.

In one embodiment, the substrate support includes a chuck body. A cooling plate is optionally disposed adjacent to the chuck body in the substrate support. A recess is formed in the cooling plate opposite the chuck body and the over temperature switch is disposed in the recess. An electrical insulator may be disposed in the substrate support and isolate various power leads passing therethrough.

Figure 1:
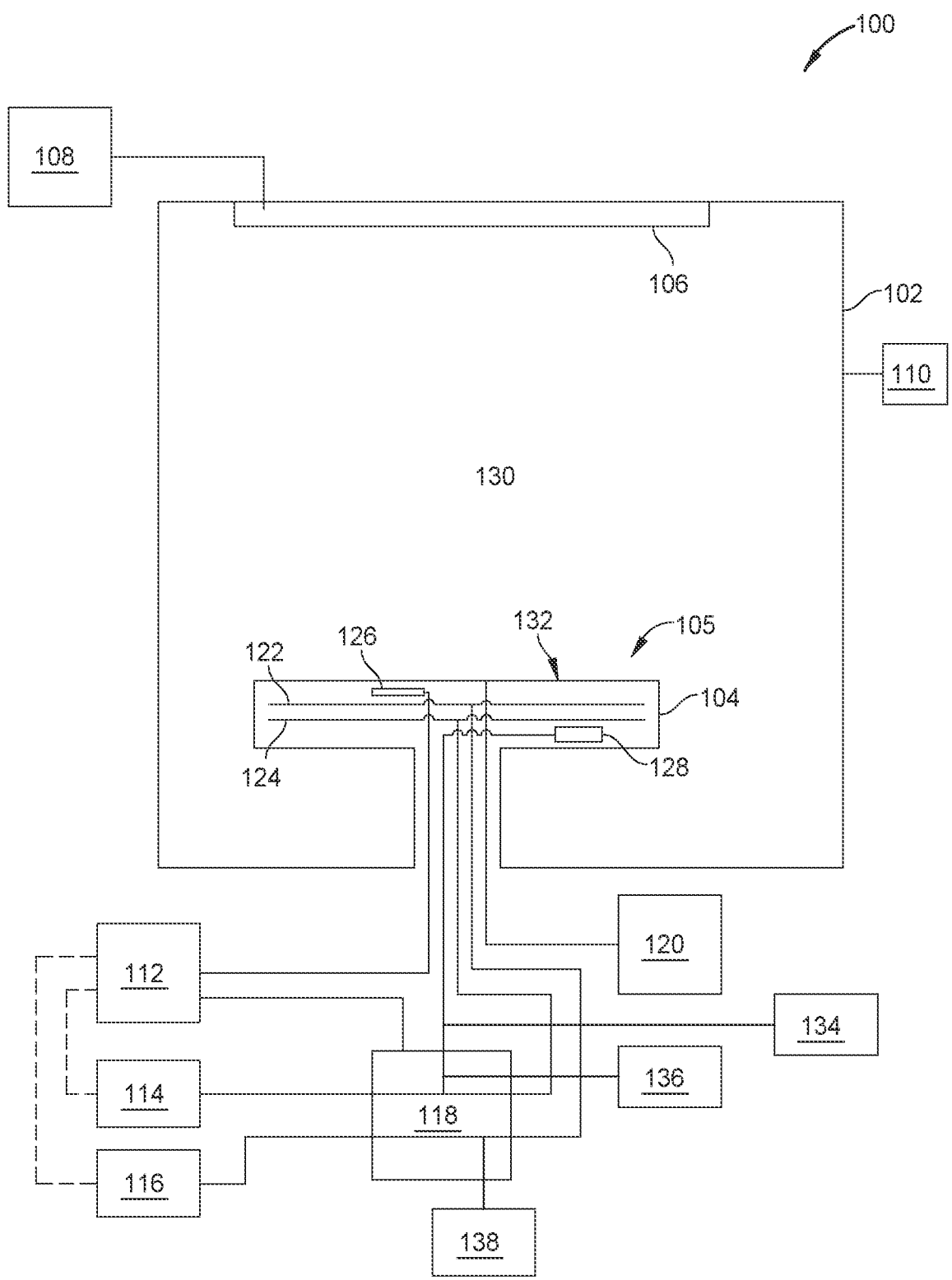
FIG. 1 is a schematic view of a process chamber according to one embodiment of the disclosure.

FIG. 1 is a schematic view of a process chamber 100 according to one embodiment of the disclosure. The process chamber 100 includes a chamber body 102 defining a process volume 130 therein. A gas source 110 is coupled to the chamber body 102. The gas source 110 supplies process gasses into the process volume 130. In one embodiment, process gases may include inert gases, non-reactive gases, and reactive gases if necessary.

A target 106 is disposed in the process volume 130. The target 106 provides a material source that can be sputtered and deposited onto a surface of a substrate during a physical vapor deposition (PVD) process. The target 106 serves as a cathode of a plasma circuit during DC sputtering.

A first power source 108 is also coupled to and provides power to the target 106. The first power source 108 facilitates sputtering materials from the target 106 onto the substrate. The first power source 108 may provide direct current (DC), pulsed DC, or radio frequency (RF) power to the target 106. In operation, the target 106 may be used as an electrode to energize gas in the process volume 130. During processing, the sputtering materials from the target 106 may be modified by addition of processes gasses from the gas source 110. The target 106 may be used to deposit, for example, oxides or nitrides on the substrate.

A substrate support 105 is disposed in the process volume 130 opposite the target 106. The substrate support 105 includes a body 104 having a support surface 132 on which the substrate is disposed during processing. The body 104 includes a heating element 124 and an over temperature switch 128 disposed therein. A second power source 114 is coupled to and provides power to the heating element 124. The second power source 114 is an alternating current (AC) power source to enable heating of the substrate support 105 and the substrate disposed thereon.

The heating element 124 may be a unitary apparatus or more than one element disposed in the substrate support 105. The heating element 124 heats the substrate support 105 and a substrate disposed on the support surface 132. The heating element 124 is a resistive heater or another suitable heater. The heating element 124 uniformly heats the substrate support 105 and the substrate disposed on the support surface 132.

In one embodiment, which can be combined with one or more embodiments described above, the substrate support 105 includes an electrostatic chuck. In that embodiment, the substrate support 105 includes an electrode 122. A third power source 116 is coupled to and provides power to the electrode 122. The electrode 122 provides a chucking voltage to the substrate support 105 to chuck the substrate to the support surface 132. The third power source 116 may also provide a bias voltage to the substrate disposed on the support surface 132.

The third power source 116 may provide DC power to the electrode 122. In some embodiments, which can be combined with one or more embodiments described above, the third power source 116 may provide alternating current (AC) power to the electrode 122. The power from the third power source 116 provides a chucking voltage to the electrode 122. The chucking voltage of the electrode 122 is between about 300 volts and about 600 volts, for example, about 400 volts. A frequency of the third power source 116 is about 2 MHz or about 13.56 MHz to bias the substrate disposed on the substrate support 105.

A radio frequency (RF) power source (not shown) may also be coupled to the electrode 122. The RF power source may enable RF bias of the electrode to modify impingement of ions from the target 106 onto the surface of the substrate. The RF bias of the electrode does not add to the chucking force applied to the substrate.

A system controller 112 is coupled to the second power source 114 and the third power source 116 to control aspects thereof. For example, the system controller 112 may control a power output of the third power source 116 and/or a power output of the second power source 114. The system controller 112 may also be coupled to other components of the process chamber 100 to control aspects thereof. For example, the system controller 112 may be coupled to the first power source 108 to control a power provided to the target 106.

A thermocouple 126 is disposed in the substrate support 105. The thermocouple 126 is coupled to the system controller 112. The thermocouple 126 may be disposed adjacent to the support surface 132 to enable accurate measurements of a temperature of the support surface 132. In some embodiments, which can be combined with one or more embodiments described above, the thermocouple 126 may be closer to the support surface 132 than the heating element 124. This arrangement may further improve accuracy of temperature measurements of the substrate support 105 and the support surface 132. In some embodiments, which can be combined with one or more embodiments described above, more than one thermocouple 126 may be disposed in the substrate support 105.

The third power source 116 and the second power source 114 are coupled to the electrode 122 and the heating element 124, respectively, through a chuck controller 118. The chuck controller 118 is coupled to the over temperature switch 128. The chuck controller 118 includes control circuitry configured to open a power supply circuit 134 between the second power source 114 and the heating element 124. The control circuitry includes a low voltage circuit portion 136 coupled to the over temperature switch 128. The control circuitry includes a high voltage switch 138 configured to open the power supply circuit 134 in response to a signal from the low voltage circuit portion 136 indicative of the over temperature switch 128 being in the open state.

The chuck controller 118 separates the signal from the over temperature switch 128 from the system controller 112 and software used to control the process performed in the process chamber 100. That is, control of the power supply circuit 134 for the heating element 124 is separate from other control signals and control circuitry of the process chamber 100.

During operation, the gas source 110 introduces a gas to the process volume 130 through the target 106. The thermocouple 126 measures a temperature of the substrate support 105. The temperature measurement is provided to the system controller 112. If the temperature measurement from the thermocouple 126 exceeds a threshold temperature, the system controller 112 may adjust a temperature of the heating element 124. For example, the system controller 112 may modify a power provided to the heating element 124 by the second power source 114 to adjust the temperature of the heating element 124.

The over temperature switch 128 is disposed in the substrate support 105. The over temperature switch 128 is electrically isolated from other components of the body 104, including the heating element 124 and the electrode 122. The over temperature switch 128 is electrically isolated from power cables coupled to the heating element 124 and the electrode 122.

The open and closed states of the over temperature switch 128 are in response to a temperature of the substrate support 105. If the temperature of the substrate support 105 rises or falls through a predefined temperature, the state of the over temperature switch 128 changes. For example, the over temperature switch 128 may be a snap switch which actuates or changes states in response to the over temperature switch 128 being exposed to a temperature of the substrate support 105 at or above a particular set point. In another example, the over temperature switch 128 is in a first or closed state (e.g., a state that is a closed circuit) when the temperature of the substrate support 105 is below the predefined temperature, and is in a second or open state (e.g., a state that is an open circuit) when the temperature of the substrate support 105 is above the predefined temperature.

When the over temperature switch 128 changes states, a signal is transmitted from the over temperature switch 128 to the chuck controller 118. In response to the signal, the chuck controller 118 opens the power supply circuit 134 of the heating element 124. That is, the chuck controller 118 physically disconnects the heating element 124 from the second power source 114. To do so, the chuck controller 118 may include or be interfaced with a relay.

In one embodiment, which can be combined with one or more embodiments described above, the state of the over temperature switch 128 is reset when the substrate support 105 returns to a temperature below the predefined temperature. When the state of the over temperature switch 128 changes because the temperature of the substrate support 105 is above the predefined temperature, an error message may be generated and provided to an operator of the process chamber 100.

In one embodiment, which can be combined with one or more embodiments described above, once the over temperature switch 128 changes states due to a temperature over the predefined temperature, a software control system (not shown) of the process chamber 100 may indicate an error has occurred. The error in the software control system may need to be cleared before proceeding with processing of the substrate. Clearing the error message ensures that an operator of the process chamber 100 is made aware of the over temperature of the substrate support 105. In this way, the over temperature switch 128 and error message enable protection of the substrate support 105 by preventing an automatic restart of the process once the over temperature switch 128 is reset.

As discussed above, the state of the over temperature switch 128 automatically changes as the temperature of the substrate support 105 decreases below the set point (e.g., predetermined temperature) of the over temperature switch 128. Similarly, the state of the over temperature switch 128 automatically changes as the temperature of the substrate support 105 increases the set point of the over temperature switch 128. Automatic change to the open state of the over temperature switch 128 kills power to the heating element 124 when the substrate support 105 is in or approaching an over-temperature condition, which protects the substrate support 105 and associated circuitry from damage, and additionally contributes to decreased downtime of the process chamber 100.

The set point of the over temperature switch 128 is generally selected to be between a process temperature of the process performed in the process chamber 100 and the maximum operating temperature of the substrate support 105. The maximum operating temperature of the substrate support 105 may be the maximum safe operating temperature of the materials comprising of the substrate support 105 and or the circuitry resisting in the substrate support 105. By opening the power supply circuit 134 of the heating element 124, the over temperature switch 128 provides protection to the substrate support 105 by substantially preventing the substrate support 105 from reaching the maximum temperature and overheating. Thus, the over temperature switch 128 substantially reduces an occurrence of damage to the substrate support 105 from overheating.

A cooling plate (not shown in FIG. 1) may be disposed in the substrate support 105. The over temperature switch 128 may be disposed adjacent to the cooling plate. The cooling plate may insulate the over temperature switch 128 from the heating element 124 and the electrode 122. The cooling plate is discussed in greater detail with respect to FIGS. 2 and 3 below.

A backside gas source 120 is coupled to the substrate support 105. The backside gas source 120 may provide a gas to the support surface 132 of the substrate support 105. The gas from the backside gas source 120 may flow into a space between the support surface 132 and the substrate disposed thereon. The gas from the backside gas source 120 enables control of heat transfer between the substrate support 105 and the substrate.

Figure 2:
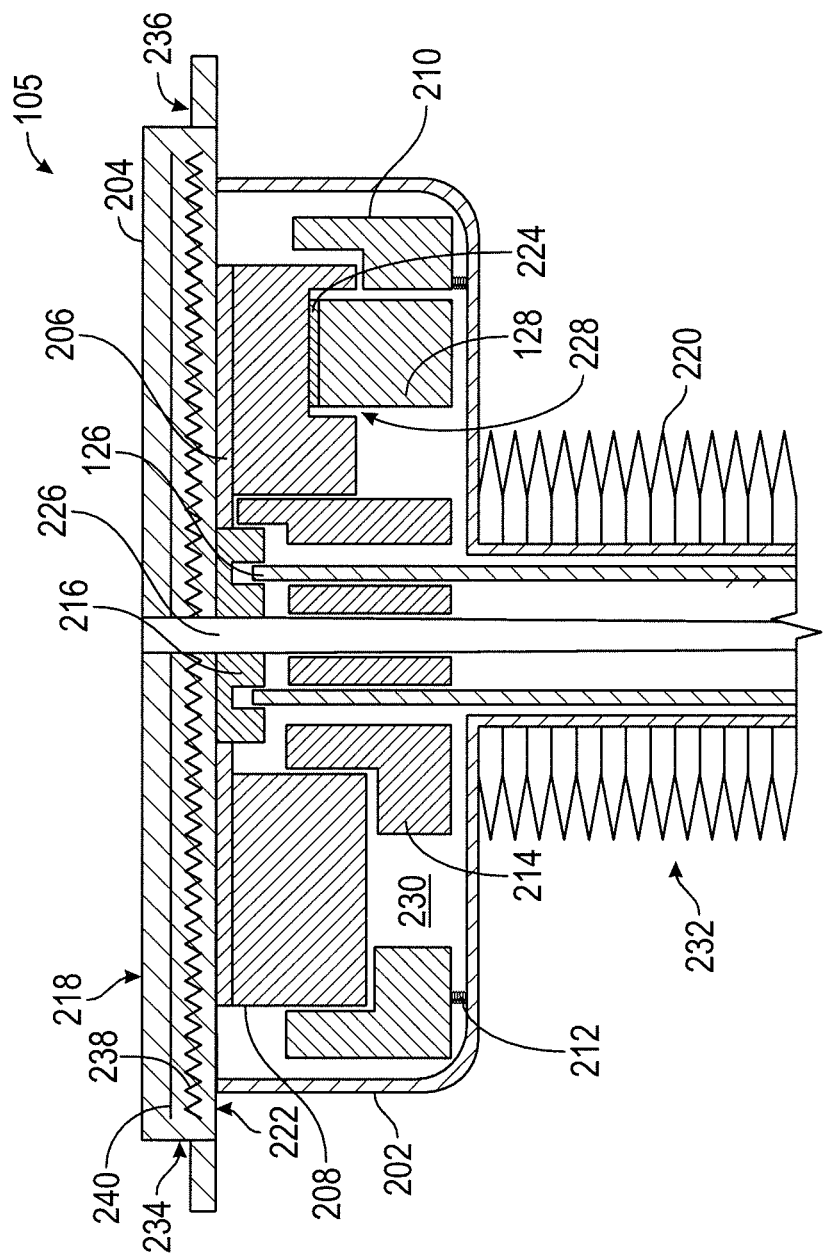
FIG. 2 is an enlarged view of a substrate support according to one embodiment of the disclosure.

FIG. 2 is an enlarged view of the substrate support 105 illustrated in FIG. 1, according to one embodiment of the disclosure. The substrate support 105 includes a housing 202 and a chuck body 204. The chuck body 204 includes a support surface 218 for supporting a substrate during processing, a bottom surface 222 opposite the support surface 218, and a side 234 extending between the support surface 218 and the bottom surface 222. The side 234 is substantially normal to the support surface 218 and the bottom surface 222. A diameter of the chuck body 204 is larger than a substrate supported thereon.

In some embodiments, the chuck body 204 includes a stepped surface 236 extending laterally from the side 234. The stepped surface 236 is substantially perpendicular to the support surface 218. A ring (not shown) may be disposed on the stepped surface 236 and surround at least a portion of the chuck body 204. The ring may substantially prevent sputter material from being deposited on the chuck body 204.

In one embodiment, which can be combined with one or more embodiments described above, the chuck body 204 is fabricated from a dielectric material. For example, the chuck body 204 may be fabricated from a ceramic material such as aluminum nitride (AlN) or aluminum oxide or another suitable material. Advantageously, ceramic material of the chuck body 204 provides an improved plasma resistance over some other materials.

The housing 202 is sealingly coupled to the bottom surface 222 of the chuck body 204 and defines an internal volume 230 therein. In one embodiment, which can be combined with one or more embodiments described above, a hermetic seal is formed between the housing 202 and the chuck body 204.

The chuck body 204 includes a heating element 238 embedded therein. The heating element 238 enables heating of the chuck body 204 and the substrate disposed thereon. The heating element 238 may be a resistive heater or other suitable heater. As an example, the heating element 238 may be a mesh of a thermally conductive material, such as molybdenum. In one embodiment, which can be combined with one or more embodiments described above, the heating element 238 is a resistive coil.

In one embodiment, which can be combined with one or more embodiments described above, the chuck body 204 is an electrostatic chuck. In that embodiment, an electrode 240 is embedded in the chuck body 204. The electrode 240 provides a chucking voltage to chuck the substrate to the support surface 218. In one embodiment, which can be combined with one or more embodiments described above, the electrode 240 is closer to the support surface 218 than the heating element 238 to provide a symmetric chucking force across the support surface 218. Further, the heating element 238 embedded deeper in the chuck body 204 enables improved reduction in thermal differences across the support surface 218.

A gas tube 226 is formed through the substrate support 105. The gas tube 226 is coaxial with a major axis of the substrate support 105 and extends through a stem 232 coupled to the substrate support 105. The gas tube 226 is coupled to a backside gas source (such as backside gas source 120 described with respect to FIG. 1). The gas tube 226 enables gas from the backside gas source to be introduced between the substrate and the support surface 218 with minimal effect on the process being performed on the substrate.

Bellows 220 surround the stem 232 and maintain a seal of the process volume in the process chamber, such as the process volume 130 described with respect to FIG. 1, as the substrate support 105 is moved between a raised position and a lowered position. In one embodiment, which can be combined with one or more embodiments described above, the internal volume 230 of the substrate support 105 is flooded with a gas. For example, the gas in the internal volume 230 may be nitrogen. The gas in the internal volume 230 may be a slow purge. Thus, the gas in the internal volume 230 may substantially prevent condensation from forming therein, which can result in arcing and damage to the substrate support 105.

The bellows 220 enable the substrate support 105 to be moved between a raised position and a lower position in the process chamber without allowing gas to flow between the process volume, such as the process volume 130, and the internal volume 230. Thus, the bellows 220 reduce an occurrence of condensation forming in the internal volume 230.

A cooling plate 208 is disposed in the substrate support 105 adjacent to the bottom surface 222 of the chuck body 204. The cooling plate 208 is positioned within the internal volume 230. The cooling plate 208 is at least partially disposed within the housing 202. A diameter of the cooling plate 208 is smaller than the diameter of the chuck body 204. In one embodiment, which can be combined with one or more embodiments described above, a thickness of the cooling plate 208 is between about 0.5 inches and about 0.7 inches, such as between about 0.622 inches and about 0.632 inches, for example about 0.627 inches.

A ring 210 is disposed adjacent to the cooling plate 208 opposite the chuck body 204. The ring 210 includes a stepped face which supports the cooling plate 208. One or more springs 212 apply pressure on the ring 210, which applies pressure on the cooling plate 208, to hold the cooling plate 208 against the chuck body 204. In one embodiment, which can be combined with one or more embodiments described above, the one or more springs 212 may be spaced about the gas tube 226 such that the pressure applied to the ring 210 by the springs 212 is evenly distributed about the ring 210. For example, the one or more springs 212 may be symmetrically disposed about the gas tube 226.

A thermally conductive layer 206 is disposed between the cooling plate 208 and the chuck body 204. In one embodiment, which can be combined with one or more embodiments described above, the thermally conductive layer 206 is a graphite foil. In one embodiment, which can be combined with one or more embodiments described above, a thickness of the thermally conductive layer 206 is between about 0.015 inches and about 0.05 inches, for example about 0.02 inches. The thermally conductive layer 206 improves heat transfer between the chuck body 204 and the cooling plate 208. One or more thermocouples 126 are disposed in the substrate support 105. The thermocouples 126 are disposed radially inward of the ring 210. The thermocouples 126 cables from the thermocouples pass through the cooling plate 208 and the stem 232.

A voltage of the thermocouples 126 is from about 0 volts to about 10 volts. The thermocouples 126 monitor the temperature of the chuck body 204 and transmit a signal to a controller, such as the system controller 112 described with respect to FIG. 1.

As described above, the signal from the thermocouples 126 may be used by the controller to adjust a power provided to the heating element, and thus adjust a temperature of the heating element 238 and the chuck body 204. A back-up ring 216 is disposed between each of the one or more thermocouples 126 and the chuck body 204. The back-up ring 216 is at least partially surrounded by the thermally conductive layer 206. The back-up ring 216 isolates the thermocouples 126 from the chuck body 204 to reduce an occurrence of damage to the thermocouples 126 due to overheating. The back-up ring 216 positions the thermocouples 126 in the internal volume 230.

A recess 228 is formed in the cooling plate 208 opposite the thermally conductive layer 206. The recess 228 is positioned radially inward of the ring 210 and radially outward of the one or more thermocouples 126. An over temperature switch 128 is at least partially disposed in the recess 228. The recess 228 provides space for the over temperature switch 128 so that the over temperature switch 128 is not in contact with the housing 202. That is, a depth of the recess 228 is provides clearance for between the over temperature switch 128 and the housing 202, thus contributing to a more compact and less costly substrate support 105. A width of the recess 228 is larger than a width of the over temperature switch 128 to provide a clearance between the recess 228 and the over temperature switch 128.

The recess 228 enables the over temperature switch 128 to be positioned proximate to the chuck body 204 so that the temperature sensed by the over temperature switch 128 is a more accurate temperature reading of the chuck body 204. Thus, the recess 228 enables the over temperature switch 128 to have a faster response time to a change in the temperature of the chuck body 204. Additionally, the recess 228 provides clearance between the over temperature switch 128 and the housing 202, allowing for a more compact and robust design.

An optional insulating pad 224 is disposed between the over temperature switch 128 and the recess 228. The insulating pad 224 electrically isolates the over temperature switch 128 from the cooling plate 208, the heating element 238, and the electrode 240. The insulating pad 224 is thermally conductive so that heat from the chuck body 204 is transferred to the over temperature switch 128. The insulating pad 224 enables accurate measurement of the temperature of the chuck body 204 while protecting the over temperature switch 128 by substantially reducing an occurrence of leakage current induced through the over temperature switch 128. Beneficially, the insulating pad 224 prevents undesired charging of the over temperature switch 128.

The over temperature switch 128 may be mounted to the cooling plate 208 via one or more non-metallic fasteners (not shown). The non-metallic fasteners further insulate the over temperature switch 128 from the cooling plate 208, the heating element 238, and the electrode 240. In one embodiment, which can be combined with one or more embodiments described above, the insulating pad 224 is fabricated from a ceramic containing material.

An insulator 214 is disposed in the substrate support 105. The insulator 214 at least partially surrounds the thermocouples 126 and the gas tube 226. The insulator 214 is disposed radially inward of the ring 210 and the over temperature switch 128. At least a portion of the insulator 214 extends from the thermally conductive layer 206 to a plane that is coplanar with a bottom surface of the ring 210. In some embodiments, at least a portion of the insulator 214 extends from the thermally conductive layer 206 to beyond the plane that is coplanar with the bottom surface of the ring 210.

The insulator 214 isolates the power cables for the heating element 238 from the power cables for the electrode 240. The insulator 214 also isolates low voltage control cables for the over temperature switch 128 from the power cables of the heating element 238 and the electrode 240. That is, the insulator 214 substantially reduces an occurrence of induced current in the over temperature switch 128 and the control cables of the over temperature switch 128 from the power leads of the heating element 238 and the electrode 240. The insulator 214 also isolates the over temperature switch 128 from the cooling plate 208. In one embodiment, which can be combined with one or more embodiments described above, the insulator 214 is fabricated from a polyether ether ketone material. In other embodiments, which can be combined with one or more embodiments described above, the insulator 214 is fabricated from a ceramic containing material. In other embodiments, which can be combined with one or more embodiments described above, the insulator 214 may be fabricated from a polytetrafluoroethylene material.

In operation, the electrode 240 provides a chucking voltage to the chuck body 204 to chuck the substrate to the substrate support 105. The heating element 238 heats the chuck body 204 and the substrate disposed thereon. The chuck body 204 can withstand a temperature up to a maximum threshold temperature, above which the chuck body 204 is damaged. For example, a temperature above 150° C. may damage the chuck body 204 and/or the circuitry therein.

A temperature at which the substrate is processed is less than the threshold temperature of the chuck body 204. A temperature at which the over temperature switch 128 trips to change a state thereof (e.g., open the power supply circuit 134 of the heating element 238) may be between the operating temperature of the process chamber and the threshold temperature of the chuck body 204. For example, a temperature at which the over temperature switch 128 changes states to open the power supply circuit 134 of the heating element 238 may be between about 120° C. and about 140° C., for example about 135° C.

Figure 3:
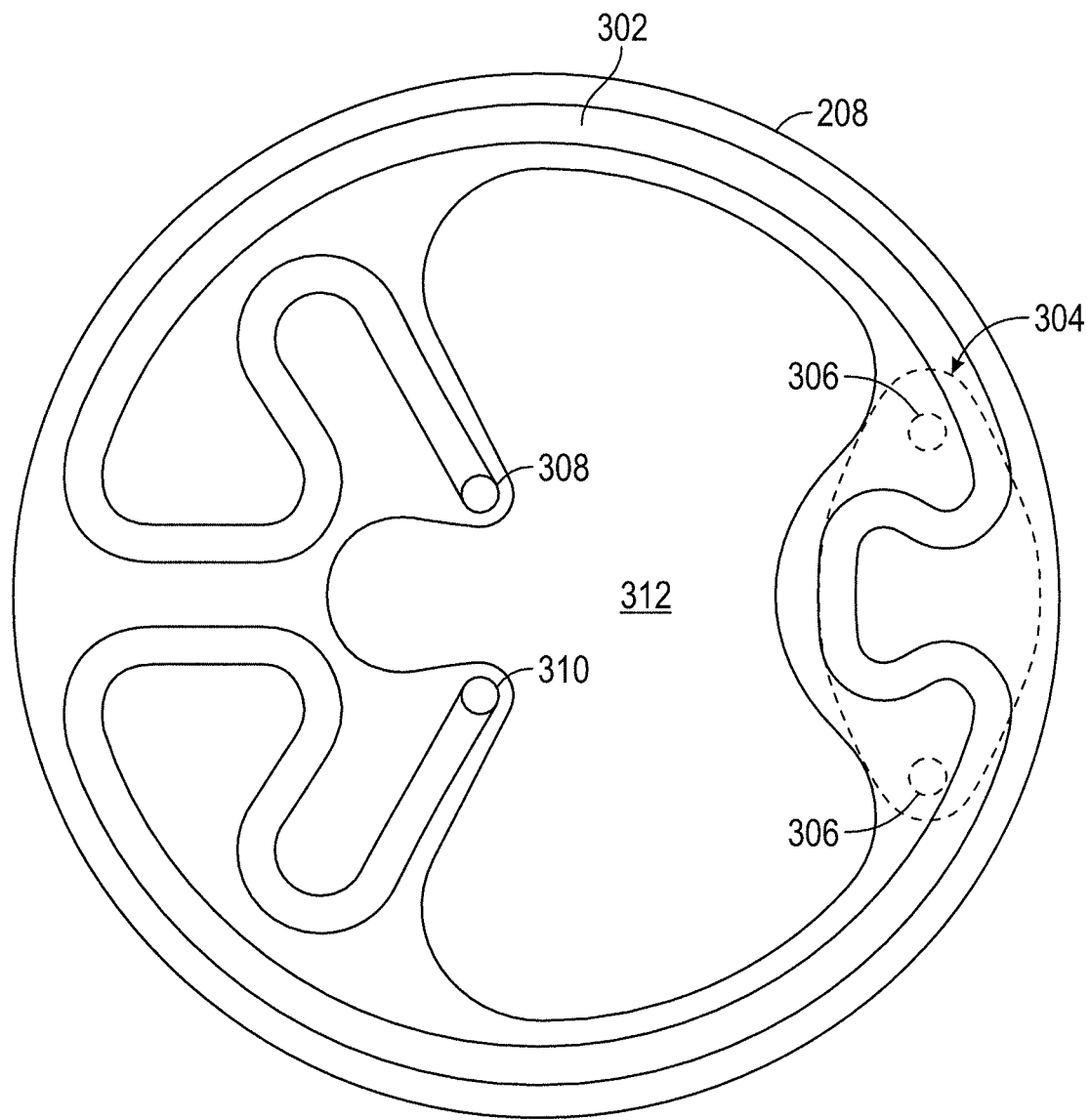
FIG. 3 is a schematic view of a cooling plate according to one embodiment of the disclosure.

FIG. 3 is a schematic view of a cooling plate 208, according to one embodiment of the disclosure. The cooling plate 208 includes a central opening 312, a cooling channel 302, one or more holes 306, an inlet 308 and an outlet 310. The central opening 312 is formed through the cooling plate 208.

The cooling channel 302 is formed in the cooling plate 208. The cooling channel 302 begins at an inlet 308 formed in the cooling plate. The cooling channel 302 serpentines through the cooling plate 208 symmetrically about the central opening 312. The cooling channel 302 terminates in the cooling plate 208 at an outlet 310. The cooling channel 302 is formed through the cooling plate 208 symmetrically across at least one axis of the cooling plate 208.

An outline 304 depicts a location of an over temperature switch, such as the over temperature switch 128 described with respect to FIG. 2, in relation to the cooling channel 302. The outline 304 is positioned in a recess (not shown in FIG. 3) formed in the cooling plate, such as the recess 228 described with respect to FIG. 2. Under the outline 304, the cooling channel 302 is symmetrically disposed about a minor axis of the outline 304. That is, the cooling channel 302 is symmetrical between one or more holes 306 formed in the cooling plate 302 within the outline 304.

The one or more holes 306 are formed in the cooling plate 208. A fastener, such as a threaded screw, may be used to mount the over temperature switch to the cooling plate 208 via the one or more holes 306. An insulator, such as the insulator 214 in FIG. 2, is disposed in and passes through the central opening 312. The cooling channel 302 begins at an inlet 308 and serpentines through the cooling plate 208 symmetrically around the central opening 312. The cooling channel 302 terminates in the cooling plate 208 at an outlet 310.

During operation, a cooling fluid is provided to the cooling channel 302 to regulate a temperature of the cooling plate 208. The cooling fluid may be flowed through the cooling channel from the inlet 308 to the outlet 310, or from the outlet 310 to the inlet 308. The cooling channel 302 is formed in the cooling plate 208 such that heat transfer from the cooling plate 208 to the cooling fluid in the cooling channel 302 is substantially uniform over the cooling plate 208.

Figure 4:
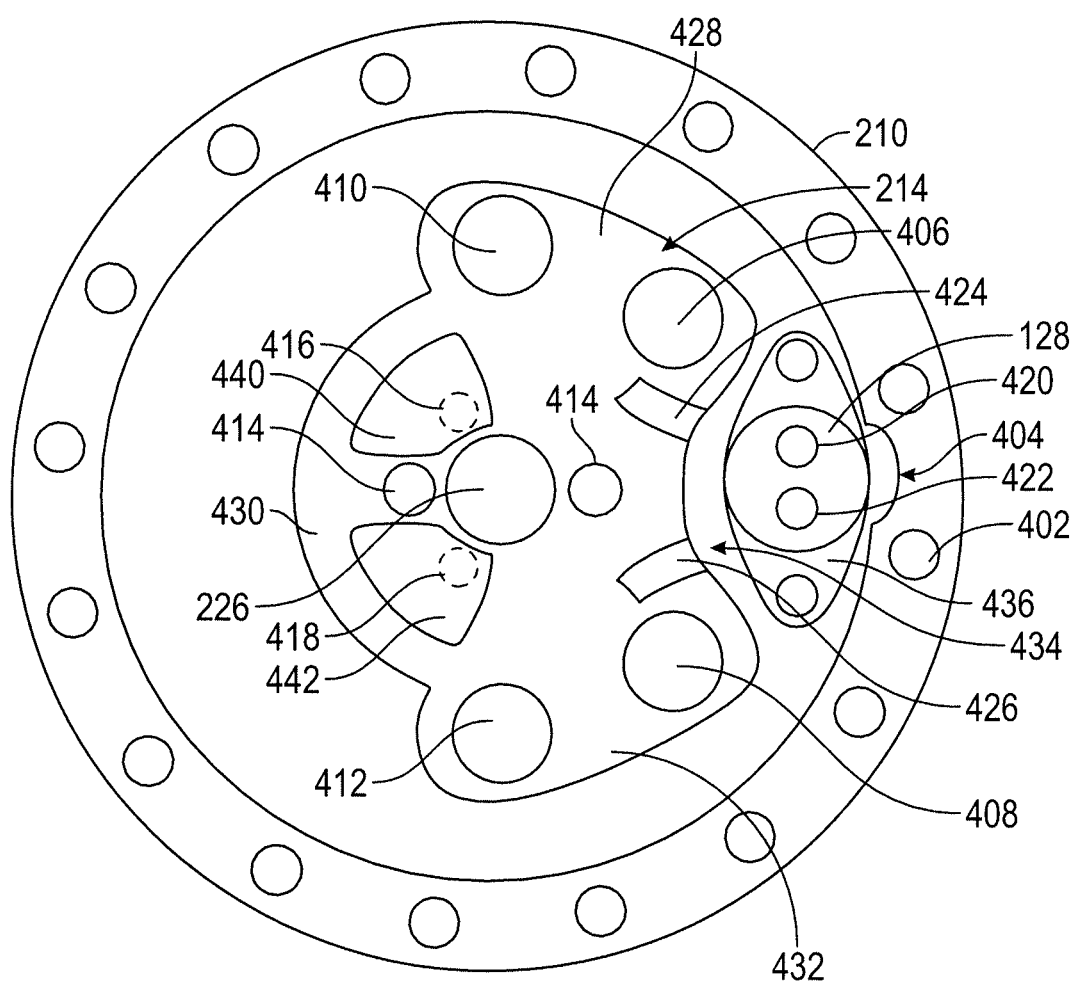
FIG. 4 is a schematic view of components of the substrate support according to one embodiment of the disclosure.

FIG. 4 is a schematic view of components of the substrate support 105 according to one embodiment of the disclosure. The insulator 214 and the over temperature switch (e.g., the over temperature switch 128 described with respect to FIGS. 1 and 2) are disposed within the ring 210. A plurality of depressions 402 are formed in the ring 210. The plurality of depressions 402 are radially distributed about the ring 210 and spaced equidistant from one another. A spring, such as the one or more springs 212 described with respect to FIG. 2, may extend into each depression 402 to apply a force on the ring 210.

A notch 404 is formed in the ring 210. The notch 404 is formed between two depressions 402. The notch 404 may be a concave indentation in an interior surface of the ring 210. The notch 404 enables clearance of a mounting bracket 436 of the over temperature switch 128 to be disposed within and adjacent to the ring 210.

As illustrated, the insulator 214 includes a first protrusion 428 and a second protrusion 432 opposite the first protrusion 428. An arc 430 connects the first protrusion 428 and the second protrusion 432. An indentation 434 also connects the first protrusion 428 and the second protrusion 432. The indentation 434 is formed in the insulator 214 opposite the arc 430. The indentation 434 enables clearance around the over temperature switch 128 so that the over temperature switch 128 can be positioned between the indentation 434 and the notch in the ring 210. A shape of the insulator 214 may be modified to enable the insulator 214 to be positioned within an opening in the cooling plate (e.g., the central opening 312 of the cooling plate 208 described with respect to FIGS. 2 and 3) and to isolate each of the leads, cables, and tubes passing therethrough.

A plurality of holes is formed through the insulator 214 to enable cables and tubing to pass therethrough. The plurality of holes includes a first hole 406, a second hole 408, a third hole 410, and a fourth hole 412. The plurality of holes also includes a fifth hole 414, a sixth hole 414, a seventh hole 440, an eighth hole 442, and a center hole 226.

The first hole 406 and the third hole 410 are formed in the first protrusion 428. The second hole 408 and the fourth hole 412 are formed in the second protrusion 432. The first hole 406, the second hole 408, the third hole 410, and the fourth hole 412 may be substantially the same size. Power leads (e.g., cables) for a heating element embedded in an substrate support (such as the heating element 238 described with respect to FIG. 2) may pass through the first hole 406 and the second hole 408. Power leads for an electrode embedded in the substrate support (such as the electrode 240 described with respect to FIG. 2) may pass through the third hole 410 and the fourth hole 412.

The center hole 226 is formed through a center of the insulator 214 and is aligned with a gas tube which is configured to be coupled to a gas source (not shown in FIG. 4). The fifth and sixth holes 414 are formed through the insulator 214 adjacent to the center hole 226. The fifth and sixth holes 414 are on opposing sides of the center hole 226. The center hole 226 and the fifth and sixth holes 414 are formed between the first and second protrusions 428 and 432 and between the arc 430 and the indentation 434. The fifth and sixth holes 414 are configured for a thermocouple cable to pass therethrough.

The seventh hole 440 and the eighth hole 442 are formed through the insulator 214 adjacent to the arc 430. The seventh hole 440 and the eighth hole 442 enable tubing 416 and 418 to pass therethrough. The tubing 416, 418 may be coupled to a cooling plate (not shown in FIG. 4) of the substrate support. Each hole in the plurality of holes may have a similar or different shape than the other holes in the plurality of holes.

During operation, a cooling fluid may flow through the tubing 416, 418 to cool the cooling plate and remove heat from the substrate support. The insulator 214 isolates cables passing through each of the first hole 406, the second hole 408, the third hole 410, the fourth hole 412, and the fifth and sixth holes 414 to substantially prevent induced current in the cables. The insulator 214 also isolates the cables passing therethrough from the ring 210. The over temperature switch 128 is mounted to the cooling plate via one or more fasteners positioned in one or more holes in the mounting bracket 436. One or more cables (not shown) are coupled to terminals 420 and 422 of the over temperature switch 128. The cables are routed from the terminals 420 and 422 through one or more grooves 424 and 426 formed in the insulator 214.

Figure 5:
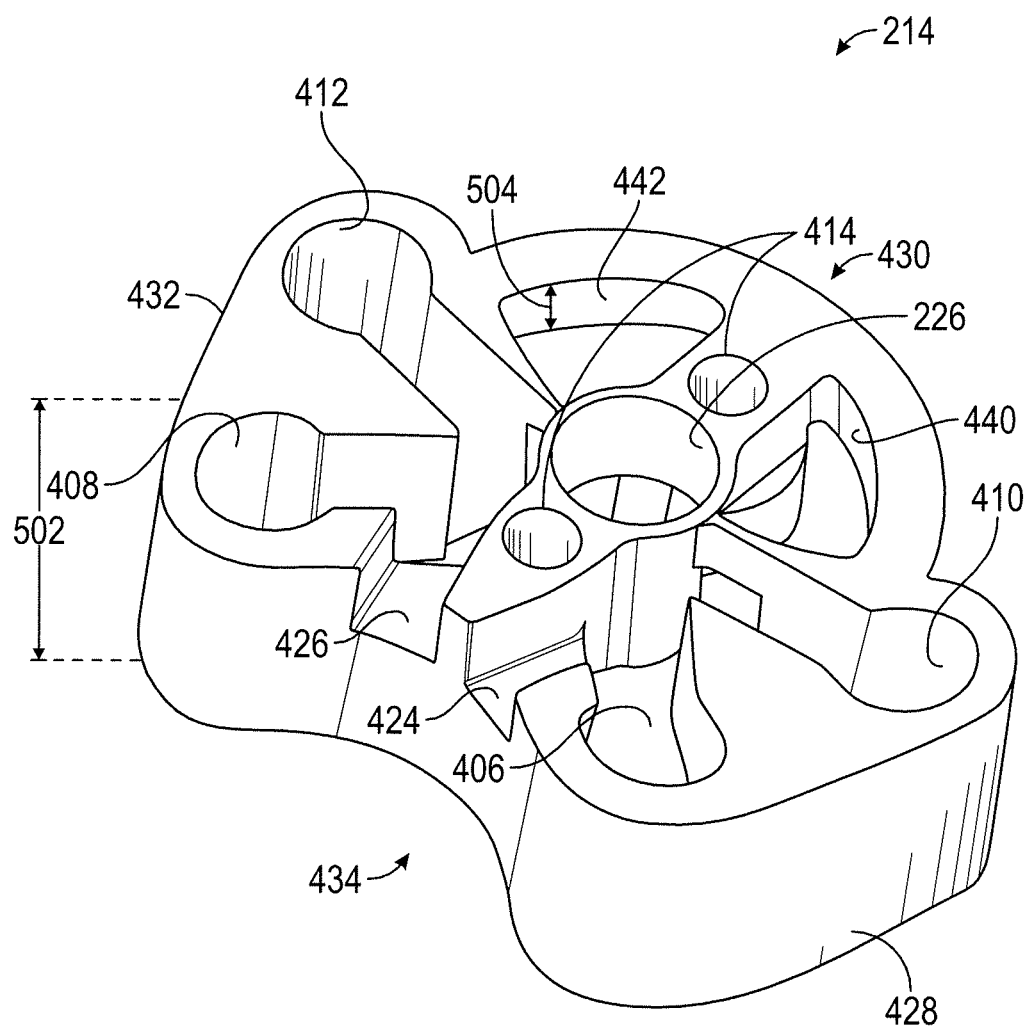
FIG. 5 is a perspective view of an insulator according to one embodiment of the disclosure.

FIG. 5 is a perspective view of the insulator 214 according to one embodiment of the disclosure. As described above, the insulator 214 includes a plurality of holes 226, 406, 408, 410, 412, and 414 formed therethrough. The grooves 424 and 426 are formed to a sufficient depth to enable the cables from the over temperature switch (e.g., the over temperature switch 128 described with respect to FIGS. 1 and 2) to be at least partially recessed into the insulator 214 and isolated from the power leads passing through the holes 406 and 408 and the cable passing through the sixth hole 414.

In one embodiment, which can be combined with one or more embodiments described above, a thickness 502 of the protrusions 428 and 432 and the indentation 434 of the insulator 214 is larger than a thickness 504 of the arc 430. The difference in thicknesses 502 and 504 of the insulator 214 enables the insulator to be positioned within the cooling plate and the substrate support, such as the cooling plate 208 and the substrate support 105 described with respect to FIG. 2.

The substrate support described herein may be used for various processes performed on a substrate. For example, the various processes may include physical vapor deposition (PVD), chemical vapor deposition (CVD), plasma etching, or variations thereof.

What is claimed is:

1. A substrate support comprising:
a chuck body having a heating element;
a cooling plate having a first surface and a second surface opposite the first surface, the first surface disposed adjacent to the chuck body;
a recess formed in the second surface of the cooling plate; and
an over temperature switch disposed in the substrate support and operable to switch states in response to detecting a temperature which exceeds a predefined temperature.

2. The substrate support of claim 1, further comprising:
an electrical insulator positioned between the recess and the over temperature switch.

3. The substrate support of claim 2, further comprising:
an electrically non-conductive fastener securing the over temperature switch to the cooling plate.

4. The substrate support of claim 1, further comprising:
an insulating pad electrically insulating the over temperature switch from the cooling plate.

5. The substrate support of claim 1, wherein the chuck body is fabricated from a ceramic containing material.

6. The substrate support of claim 1, further comprising:
a control circuitry configured to open a power supply circuit providing power to the chuck body in response to the over temperature switch changing to an open state.

7. A substrate support comprising:
a chuck body having a heating element;
an over temperature switch disposed in the substrate support and operable to switch states in response to detecting a temperature which exceeds a predefined temperature;
a cooling plate having a first surface and a second surface opposite the first surface, the first surface disposed adjacent to the chuck body;
an opening formed through the cooling plate;
an electrical insulator disposed in through the opening, the electrical insulator comprising:
a first hole having a first power lead extending therethrough and coupled to an electrode disposed in the chuck body;
a second hole having a second power lead extending therethrough and coupled to the electrode;
a third hole having a third power lead extending therethrough and coupled to a heater disposed in the chuck body;
a fourth hole having a fourth power lead extending therethrough and coupled to the heater;
a fifth hole having an inlet tube extending therethrough and coupled to the cooling plate;
a sixth hole having an outlet tube extending therethrough and coupled to the cooling plate;
a first groove formed into a surface of the electrical insulator opposite the chuck body, the first groove having a first low voltage lead extending therethrough and coupled to a control circuit; and
a second groove formed into the surface of the electrical insulator opposite the chuck body, the second groove having a second low voltage lead extending therethrough and coupled to the control circuit.

8. The substrate support of claim 7, further comprising:
a housing sealingly coupled to and defining an internal volume with the chuck body, the cooling plate disposed in the internal volume; and a stem sealingly coupled to the housing through which the first, second, third, and fourth power leads, the first and second low voltage leads, and the inlet and outlet tubes are routed.

9. A substrate support comprising:
a chuck body having a heating element;
an over temperature switch disposed in the substrate support and operable to switch states in response to detecting a temperature which exceeds a predefined temperature;
control circuitry configured to open a power supply circuit providing power to the chuck body in response to the over temperature switch changing to an open state;
a low voltage circuit portion coupled to the over temperature switch; and
a high voltage switch configured to open the power supply circuit in response to a signal from the low voltage circuit portion indicative of the over temperature switch being in the open state.

10. The substrate support of claim 9, further comprising:
a controller coupled to the power supply circuit to control the power provided to the chuck body, the controller separate from the control circuitry.

11. A substrate support comprising:
a chuck body having a heating element disposed therein;
a cooling plate having a first surface and a second surface opposite the first surface, the first surface disposed adjacent to the chuck body;
a recess formed in the second surface of the cooling plate;
an opening formed through the cooling plate;
a central insulator disposed in the opening;
an over temperature switch disposed in the recess and operable to switch states in response to the cooling plate exceeding a predefined temperature; and
an electrical insulator disposed between the recess and the over temperature switch.

12. The substrate support of claim 11, wherein the electrical insulator is fabricated from a ceramic material and electrically insulates the over temperature switch from the cooling plate.

13. The substrate support of claim 11, further comprising:
a channel formed within the cooling plate, the channel configured to be coupled to a fluid source.

14. The substrate support of claim 13, wherein the channel is substantially parallel to the first surface of the cooling plate.

15. The substrate support of claim 14, wherein the channel is symmetrically disposed about an opening formed through the cooling plate.

16. A substrate support comprising:
a chuck body;
a cooling plate having a first surface and a second surface opposite the first surface, the first surface disposed adjacent to the chuck body;
a recess formed in the second surface of the cooling plate;
an opening formed through the cooling plate;
a central insulator disposed in the opening;
an over temperature switch disposed in the recess and operable to switch states in response to the cooling plate exceeding a predefined temperature;
one or more grooves formed in the central insulator;
one or more low voltage cables coupled to the over temperature switch and at least partially disposed in the grooves; and
an electrical insulator disposed between the recess and the over temperature switch.

17. The substrate support of claim 16, further comprising:
a control circuitry configured to open a power supply circuit providing power to the chuck body in response to the over temperature switch changing to an open state; and
a controller coupled to the power supply circuit to control a power provided to the chuck body, the controller separate from the control circuitry.

18. The substrate support of claim 17, wherein the control circuitry further comprises:
a low voltage circuit portion coupled to the over temperature switch; and
a high voltage switch configured to open the power supply circuit in response to a signal from the low voltage circuit portion indicative of the over temperature switch being in the open state.

* * * * *